United States Patent [19]

Veenendaal

[11] Patent Number: 4,673,839
[45] Date of Patent: Jun. 16, 1987

[54] PIEZOELECTRIC PRESSURE SENSING APPARATUS FOR INTEGRATED CIRCUIT TESTING STATIONS

[75] Inventor: Cornelis T. Veenendaal, Cornelius, Oreg.

[73] Assignee: Tektronix, Inc., Beaverton, Oreg.

[21] Appl. No.: 905,358

[22] Filed: Sep. 8, 1986

[51] Int. Cl.⁴ ............................................. H01L 41/08
[52] U.S. Cl. ..................... 310/338; 310/328; 310/345; 310/369; 324/158 P
[58] Field of Search ............... 310/338, 339, 328, 345, 310/369; 324/51, 62, 64, 65 P, 158 F, 158 P, 61 P, 72, 72.5, 73 R, 73 AT, 73 PC, 76 R

[56] References Cited
U.S. PATENT DOCUMENTS

| 3,213,666 | 10/1965 | Rudnick | 310/338 X |
| 3,810,016 | 5/1974 | Chayka et al. | 324/158 P |
| 3,832,632 | 8/1974 | Ardezzone | 324/158 P |
| 3,996,516 | 12/1976 | Luther | 324/158 P |
| 4,079,362 | 3/1978 | Grimm et al. | 310/345 X |

Primary Examiner—Mark O. Budd
Attorney, Agent, or Firm—Jay K. Malkin; William S. Lovell

[57] ABSTRACT

A pressure sensing apparatus for use in an integrated circuit testing station is disclosed. The testing station includes a probe, a support structure, and lift means for moving an integrated circuit upward toward the probe. The invention specifically consists of a pressure pad secured to the support structure directly above the probe. The pad includes a resilient body portion having a rigid tip. Embedded within the pad is a piezoelectric element having electrical contact leads attached thereto. When the testing station is used, an integrated circuit is moved upward by the lift means toward the probe. As the circuit contacts the probe, it moves the probe upward. As the probe moves upward, it pushes on the pad, causing internal pressures to be generated therein. Such pressures are transmitted to the piezoelectric element which generates electrical impulses proportional to the pressures exerted on the pad.

15 Claims, 4 Drawing Figures

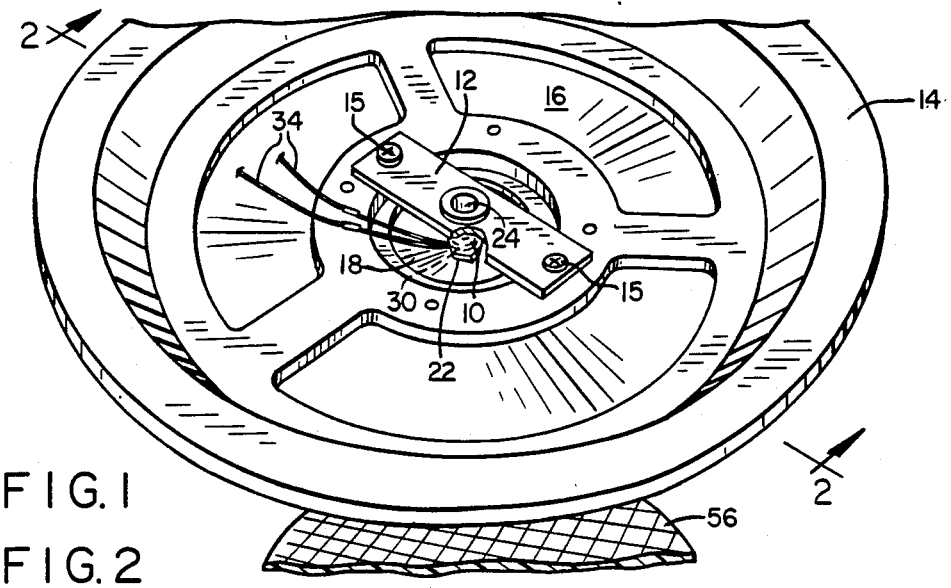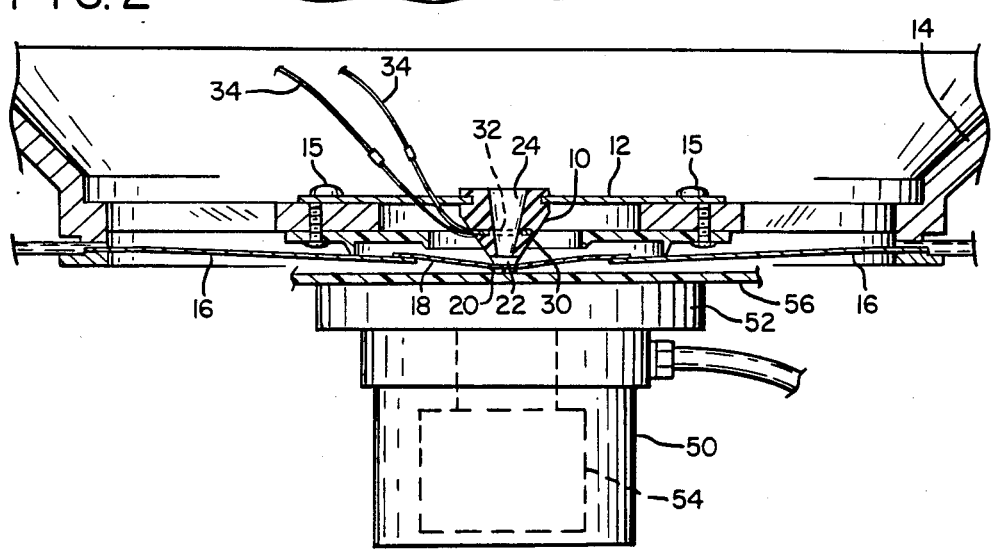

PIEZOELECTRIC PRESSURE SENSING APPARATUS FOR INTEGRATED CIRCUIT TESTING STATIONS

BACKGROUND OF THE INVENTION

The present invention generally relates to probe systems used in integrated circuit testing stations, and more particularly to a piezoelectric pressure sensing apparatus for determining the amount of pressure exerted on an integrated circuit test probe during use.

An important step in the production of integrated circuits involves the testing of each circuit to determine whether it has been properly manufactured. It is generally desirable to evaluate the performance of integrated circuits as early as possible in the fabrication process. To accomplish this, electrical connections are made to all of the integrated circuit's external connection points. Test signals are then applied to the circuit, and its performance is evaluated.

To test integrated circuits in an efficient manner, an integrated circuit test probe system has been developed by Tektronix, Inc. of Beaverton, Oreg. which is the subject of co-pending patent applications. This system consists of a flexible probe in the form of a small square of transparent polyimide film approximately 0.001" thick. The underside of the film includes a plurality of metal pads deposited thereon. The metal pads are preferably manufactured from nickel, and are arranged in a pattern which matches the contact areas (bond pads) on the integrated circuit. The metal pads on the polyimide film probe are electrically connected by transmission lines routed to the edges of the film probe using, for example, microstrip line geometry techniques.

In a preferred form of the probe system, a ground plane is deposited on the top surface of the polyimide film. However, the ground plane does not cover the areas of the film in the vicinity of the metal pads. As a result, the metal pads can be viewed through the film, thereby permitting visual alignment of the pads with respect to the circuit being tested.

The polyimide film probe is mounted to and supported along its edges by a printed circuit board. Transmission lines on the printed circuit board provide a connection between the probe and coaxial connectors along the outside periphery of the printed circuit board.

To use the above-described testing system, the polyimide film probe and printed circuit board are mounted in a fixed position on a support structure. Beneath the probe and support structure, an apparatus is provided which includes means for elevating the circuit to be tested upward toward the probe. Preferably, a vacuum chuck device is used which includes a platform having a vacuum system for maintaining an integrated circuit chip or wafer thereon, and a stepper motor for progressively elevating the platform and circuit upward toward the probe. To test the integrated circuit, the circuit must be raised upward in an amount sufficient to contact the metal pads on the underside of the probe.

However, it is necessary to monitor the contact pressure between the circuit and probe so that such pressure can be determined and repeated in consecutive tests. Repeated testing of the circuit is necessary in order to obtain an accurate measurement of the performance capability of the circuit. In addition, the contact pressure must be monitored to ensure that the circuit will not exert undue pressure on the probe when the metal pads of the probe contact the circuit. If the stepper motor in the vacuum chuck is not precisely controlled, excessive pressure will be generated by the upward movement of the integrated circuit against the polyimide film probe. Such pressure can cause significant damage to the probe. Typically, a pressure level of 3 grams exerted on each probe pad will be sufficient to enable proper testing of the circuit in a non-destructive manner. Pressure levels exceeding 10 grams per probe pad are likely to cause damage. However, this value may vary, depending on the type and thickness of the probe being used.

The present invention represents a probe station accessory for sensing the amount of pressure exerted on a test probe by an upwardly-moving integrated circuit. As a result, the amount of pressure being applied can be accurately determined.

SUMMARY OF THE INVENTION

It is an object of the present invention to provide a pressure sensing apparatus for an integrated circuit testing station capable of accurately measuring the pressure exerted on an integrated circuit test probe during use.

It is another object of the present invention to provide a pressure sensing apparatus for an integrated circuit testing station which is characterized by a high degree of sensitivity.

It is a further object of the present invention to provide a pressure sensing apparatus which contains a minimal number of operational components, is simple to manufacture, and requires minimal maintenance after repeated usage.

The present invention represents a pressure sensing apparatus for use in an integrated circuit testing station. The integrated circuit testing station has a probe secured to a support structure, and lift means for moving an integrated circuit upward toward the probe. The invention specifically consists of a pressure pad secured to the support structure directly over the probe. The pressure pad includes a resilient body portion having a rigid tip. Embedded within the pressure pad is a piezoelectric element having electrical contact leads attached thereto. To test an integrated circuit, the circuit is moved upward by the lift means toward and against the probe. As the circuit comes into contact with the probe, it correspondingly moves the probe upward. As the probe moves upward, it pushes on the pressure pad, causing internal pressures to be generated therein. Such pressures are transmitted to the piezoelectric element in the pad which generates electrical impulses. The electrical impulses are transmitted via the electrical contact leads to an appropriate detector or controller associated with the lift means. As a result, the pressures exerted on the probe during testing of an integrated circuit can be closely monitored and controlled.

These and other objects, features, and advantages of the invention will be further described in the following drawings and detailed description of a preferred embodiment.

BRIEF DESCRIPTION OF THE DRAWINGS

FIG. 1 is a perspective view of the present invention mounted to a support structure.

FIG. 2 is a partial cross sectional view taken along lines 2—2 of FIG. 1.

FIG. 3 is a cross sectional, enlarged view of the present invention in association with a test probe.

FIG. 4 is a cross sectional, enlarged view of an alternative embodiment of the present invention in association with a test probe.

DETAILED DESCRIPTION

The present invention represents an apparatus designed to sense the pressure exerted on a polyimide film probe in an integrated circuit testing station. With reference to FIGS. 1 and 2, the invention consists of a resilient pressure pad 10 secured to a rigid mounting member 12. The mounting member 12 is attached to a support structure 14 using screws 15. The support structure 14 is secured to a stationary support frame (not shown). Also secured to the support structure 14 beneath the pressure pad 10 as illustrated in FIG. 2 is a printed circuit board 16 having a polyimide film probe 18 which includes a plurality of metal test pads 20, preferably manufactured of nickel and plated on the underside of the probe 18. As described above, the probe 18 is covered by a ground plane except for the areas overlying the test pads 20. As a result, the probe 18 is transparent in the vicinity of the test pads 20.

The pressure pad 10 is preferably manufactured of transparent silicone rubber or other resilient material which may be compressed and will return after compression to its original shape. The pad 10 includes a tip 22 preferably manufactured of a hard, transparent plastic (e.g. clear acrylic plastic). The pressure pad 10 and attached tip 22 are positioned directly over the polyimide film probe 18, as shown in FIGS. 2 and 3.

With continued reference to FIG. 3, the pressure pad 10 includes a bore 24 through the center longitudinal axis of the pad 10 which enables a user of the testing station to look with the aid of a microscope directly downward through the pressure pad 10 and tip 22 into the transparent area of the polyimide film probe 18. This facilitates proper alignment of the polyimide film probe 18 with the integrated circuit being tested.

The pressure pad 10 also includes a piezoelectric element 30 mounted therein. A piezoelectric element typically consists of a material having the ability to generate a voltage when mechanical force is applied thereto. In the present invention, the piezoelectric element 30 is preferably manufactured from barium titanate and is in the shape of a ring having an open center region 32.

The piezoelectric element 30 is molded within the pressure pad 10 so that the bore 24 passes downwardly through the open center region 32 of the piezoelectric element 30, thereby permitting an unobstructed view through the pressure pad 10. However, if a transparent piezoelectric element 30 is used, the element 30 may be disc-shaped without an open center region 32 (FIG. 4). A suitable transparent material usable as the piezoelectric element 30 would include quartz.

Regardless of form, the piezoelectric element 30 further includes a plurality of electrical contact leads 34 attached thereto which permit the transmission of electrical impulses from the piezoelectric element 30 out of the pressure pad 10 to an appropriate detector or control unit, as discussed below.

OPERATION

With reference to FIG. 2, a support structure 14 is shown to which a printed circuit board 16 and polyimide film probe 18 are attached. The support structure 14 also includes a rigid mounting member 12 to which the pressure pad 10 is secured.

Beneath the support structure 14 is a vacuum chuck apparatus 50 including a platform 52 and an internal stepper motor 54 for vertically moving the platform 52. Secured to the platform 52 by a vacuum generated using the vacuum chuck 50 is an integrated circuit chip or wafer 56 to be tested. To test the circuit 56, the stepper motor 54 is activated, causing elevation of the platform 52 and integrated circuit 56 upward toward the polyimide film probe 18. The integrated circuit 56 is aligned with the probe 18 by viewing downwardly through the bore 24 in the pressure pad 10. As the platform 52 of the vacuum chuck 50 moves upward with the circuit 56 thereon, the circuit 56 comes into contact with the metal test pads 20 on the underside of the polyimide film probe 18. Once contact has been achieved, the polyimide film probe 18 begins to move upward, exerting pressure on the pressure pad 10. Since the pressure pad 10 is fixedly secured to the support structure 14 using the rigid mounting member 12, significant compressive forces are generated within the pressure pad 10. The compressive forces within the pressure pad 10 cause corresponding compression of the piezoelectric element 30, thereby generating electrical impulses along and through electrical contact leads 34. The contact leads 34 may be connected to a suitable detector or controller which would stop the upward movement of the platform 52 and circuit 56 when a specific pressure level is reached.

Use of the present invention permits an accurate determination of the contact pressure between the probe and circuit, permitting repeated tests of the circuit at such pressure. Repeated testing in this manner results in an improved performance evaluation of the circuit. Furthermore, a determination of pressure levels in the above manner may be used to prevent damage to the probe by the application of excessive pressure thereto.

Having described a preferred embodiment of the present invention, it is intended that suitable modifications may be made by one skilled in the art within the scope of the invention. Therefore, the scope of the invention should only be construed in accordance with the following claims.

I claim:

1. A pressure sensing apparatus for use in an integrated circuit testing station having a test probe secured to a support structure comprising:
   a resilient pressure pad secured to said support structure directly above said probe; and
   a piezoelectric element embedded within said pressure pad for detecting pressures exerted on said pressure pad during said testing, said piezoelectric element generating electrical impulses proportional to the pressures exerted on said pressure pad during said testing.

2. The pressure sensing apparatus of claim 1 wherein said pressure pad further comprises a rigid tip secured thereto.

3. The pressure sensing apparatus of claim 2 wherein said tip is comprised of transparent plastic.

4. The pressure sensing apparatus of claim 1 wherein said pressure pad comprises a longitudinal bore therethrough sized to enable a user to look downwardly through said pressure pad into said probe.

5. The pressure sensing apparatus of claim 1 wherein said pressure pad is comprised of transparent silicone rubber.

6. The pressure sensing apparatus of claim 1 wherein said piezoelectric element is comprised of a material selected from the group consisting of quartz and barium titanate.

7. The pressure sensing apparatus of claim 1 wherein said piezoelectric element is ring-shaped with an open center region therein, and includes a plurality of electrical contact leads secured thereto so as to permit the transmission of electrical impulses from said piezoelectric element out of said pressure pad.

8. The pressure sensing apparatus of claim 1 wherein said piezoelectric element is transparent and disc-shaped, and includes a plurality of electrical contact leads secured thereto so as to permit the transmission of electrical impulses from said piezoelectric element out of said pressure pad.

9. A pressure sensing apparatus for use in an integrated circuit testing station having a probe secured to a support structure comprising:
   a resilient pressure pad secured to said support structure directly above said probe comprising a longitudinal bore therethrough sized to enable a user to look downwardly through said pressure pad into said probe;
   a rigid tip secured to said pressure pad;
   a piezoelectric element embedded within said pressure pad for detecting pressures exerted on said pressure pad during said testing, said piezoelectric element generating electrical impulses proportional to the pressures exerted on said pressure pad during said testing; and
   a plurality of electrical contact leads secured to said piezoelectric element so as to permit the transmission of electrical impulses from said piezoelectric element out of said pressure pad.

10. The pressure sensing apparatus of claim 9 wherein said pressure pad is comprised of transparent silicone rubber.

11. The pressure sensing apparatus of claim 9 wherein said tip is comprised of transparent plastic.

12. The pressure sensing apparatus of claim 9 wherein said piezoelectric element is ring-shaped with an open center region therein.

13. The pressure sensing apparatus of claim 12 wherein said piezoelectric element is comprised of barium titanate.

14. The pressure sensing apparatus of claim 9 wherein said piezoelectric element is transparent and disc-shaped.

15. The pressure sensing apparatus of claim 14 wherein said piezoelectric element is comprised of quartz.

* * * * *